United States Patent [19]

Onose et al.

[11] Patent Number: 4,920,453
[45] Date of Patent: Apr. 24, 1990

[54] PROGRAMMABLE CONTROLLER MODULE

[75] Inventors: Kazuhiko Onose, Aichi, Japan; Willard B. Ott, New Berlin, Wis.

[73] Assignees: Allen-Bradley Company, Inc., Milwaukee, Wis.; Nippondenso Company, Ltd., Japan

[21] Appl. No.: 257,400

[22] Filed: Oct. 13, 1988

[51] Int. Cl.$^5$ ............................................. H05K 7/00
[52] U.S. Cl. .................................... 361/392; 361/394; 361/428
[58] Field of Search ................................ 361/392–396, 361/399, 413, 415, 428, 429

[56] References Cited

U.S. PATENT DOCUMENTS

| 4,293,924 | 10/1981 | Struger et al. | 364/900 |
| 4,652,769 | 3/1987 | Smith et al. | 361/394 |
| 4,672,511 | 6/1987 | Meusel et al. | 361/415 |
| 4,738,632 | 4/1988 | Schmidt et al. | 361/393 |

FOREIGN PATENT DOCUMENTS 3038719 10/1981 Fed. Rep. of Germany ...... 361/383

Primary Examiner—Gregory N. Thompson
Attorney, Agent, or Firm—Quarles & Brady

[57] ABSTRACT

A module for electrical connection to a rack forming a part of programmable controller is provided which includes a body member having a display portion and a circuit board terminal block connected to the body member. A door is hingedly attached to the body member, and has a panel presenting a surface adapted to be marked with the usual marking pen or pencil for identifying the module. In other embodiments, the module includes an additional panel portion for placement of an identifying label, a snap fitment arrangement for attachment to the rack as well as guide slots in the rack for the circuit board and a wire tie arrangement for holding electrical wires in a consolidated manner.

4 Claims, 3 Drawing Sheets

PROGRAMMABLE CONTROLLER MODULE

BACKGROUND OF THE INVENTION

The present invention relates to programmable controllers having a plurality of input and output modules for performing different functions which operate a machine in response to the execution of a control program. More particularly, it relates to an improved module having various features for improving its usage with a programmable controller.

The modules of the type concerned herein are utilized in conjunction with programmable controllers which are connected to industrial equipment such as assembly lines and machine tools, to sequentially operate equipment in accordance with a stored control program. One type of such programmable controller is disclosed in U.S. Pat. No. 4,293,924 and consists of a rack which contains several functional modules. A rack backplane provides signal buses and connectors for electrically coupling the functional modules. One of these modules contains a processor which sequentially executes the control program. The control program is stored in a memory within the processor module and is executed to examine the condition of selected sensing devices on the controlled equipment, or to energize and deenergize selected operating devices on the controlled equipment contingent upon the status of one or more of the examined sensing devices. Also contained within the rack are a number of input/output (I/O) modules, which interface the processor to the sensing and operating devices. These modules can be of various different types, such as a.c. inputs or outputs, d.c. inputs or outputs, analog inputs or outputs, and open or closed loop positioning modules.

The I/O module types can be varied so as to operate a wide variety of equipment. This presents a problem in knowing what particular circuitry is wired to the module so that it can be readily distinguishable from the outside of the module. Further, it is advantageous in utilizing the foregoing modules if the connection for the wiring is readily accessible and an identifiable label could be placed in a panel to identify the circuitry. Other features which can be advantageous are a casing member which includes snap fitment means for engagement with the electrical rack and a rack which includes ventilating openings as well as guide slots for a module circuit board. It would also be helpful in the fabrication of the module if there were provided a self-taping boss on the circuit board terminal block for engagement with the screw to fasten the circuit board to the casing as well as a provision for tying the various wires in a secure manner which are connected to the circuit board terminal block.

SUMMARY OF THE INVENTION

A module for electrical connection to a rack includes a body or casing member having a display portion and a connector portion for connection with a circuit board terminal block. There is provided a door hingedly attached to the body member. The door presents a surface adapted to be marked with the usual marking pen or pencil. The body member can include a panel portion upon which a circuit identifying label can be placed. Snap fitment means are also included in the module for engagement with an electrical rack. The rack in a preferred manner has ventilating openings and guide slots for the circuit board. Also preferably, the module body includes a counter bore for a self-tapping screw which taps into the terminal block. There is also a self-return guide for a wiretie for securing the wires connected to the circuit board terminal block.

The general object of the invention is to provide an improved I/O module for use in a programmable control.

Another object is to provide an identification means on the outside of the module.

Yet another object is to provide an improved module which can be readily assembled with an electrical rack.

A further object is to provide a combined module and rack wherein the rack has ventilating openings as well as guide slots for the circuit board.

Still another object is to provide a module of the foregoing type wherein the circuit board can be readily secured to the module body and the wires for connection to the module can be easily secured thereto.

DETAILED DESCRIPTION OF THE PRESENT INVENTION

Figure 1:
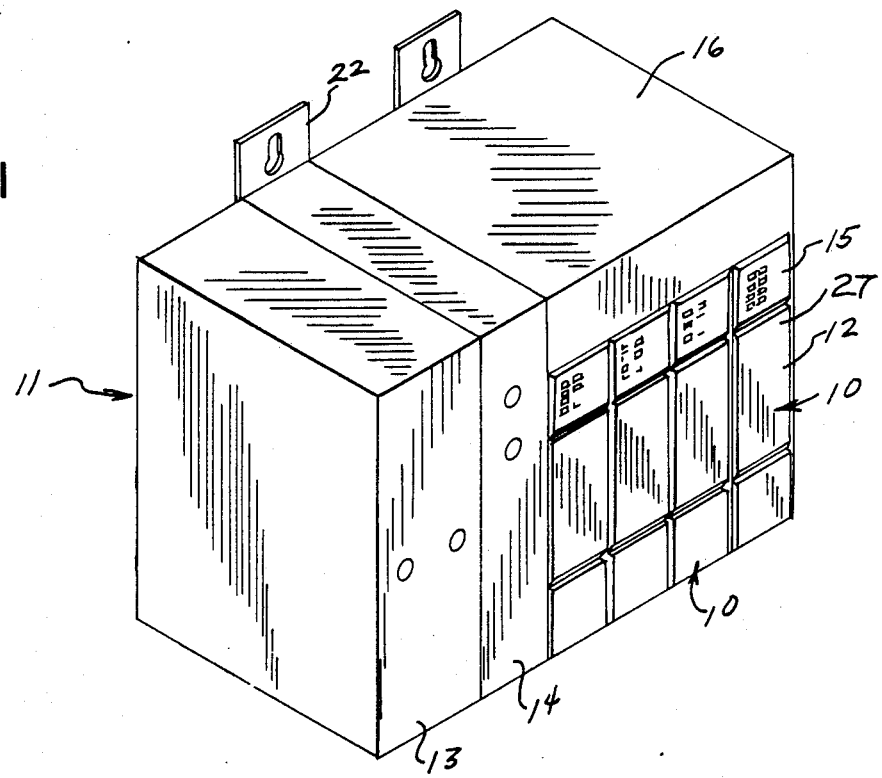
FIG. 1 is a perspective view showing several of the modules of this invention in combination with a controller.

With reference to FIG. 1, several of the modules such as indicated generally at 10 are shown in the controller generally 11 which will also include a power supply 13 and a processor module 14. The module 10 electrically interfaces the processor module 14 to sensing and operating devices on a machine controlled by the controller 11. As used herein, the term I/O module refers to a module which interfaces to external devices on the controlled machine. Such I/O modules can have solely an input function, solely an output function or both input and output functions. I/O modules which provide an input function couple the processor module 14 to sensing devices on a controlled machine, while the output function modules interfere to operating devices on the controlled machine. Each of the I/O modules 10 may be an a.c. input or output device, a d.c. input or output device or provide an input/output interface to handle all devices, such as resolvers and position indicators. The typical programmable controller 11 includes a mix of different types of I/O modules.

The modules 10 of this invention have several unique features. For example, as best illustrated in FIG. 1 it will seen that the front panel 12 of the module is composed of an ABS polycarbonate plastic material which is textured so as to provide a writable surface 27. This affords a means of indicating that a certain module 10 is being used such as by means of a mere "X" designation. Alternatively, the function of the module 10 can be indicated in writing. In either event such designations can be viewed from the outside. Module 10 also has the usual LED section 15 to indicate the functioning of the module.

Figure 3:
FIG. 3 is a view taken along line 3—3 of FIG. 2.
Figure 4:
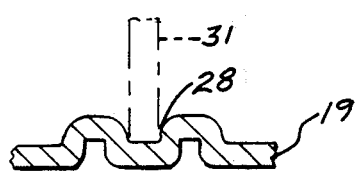
FIG. 4 is a view taken along line 4—4 of FIG. 2.
Figure 2:
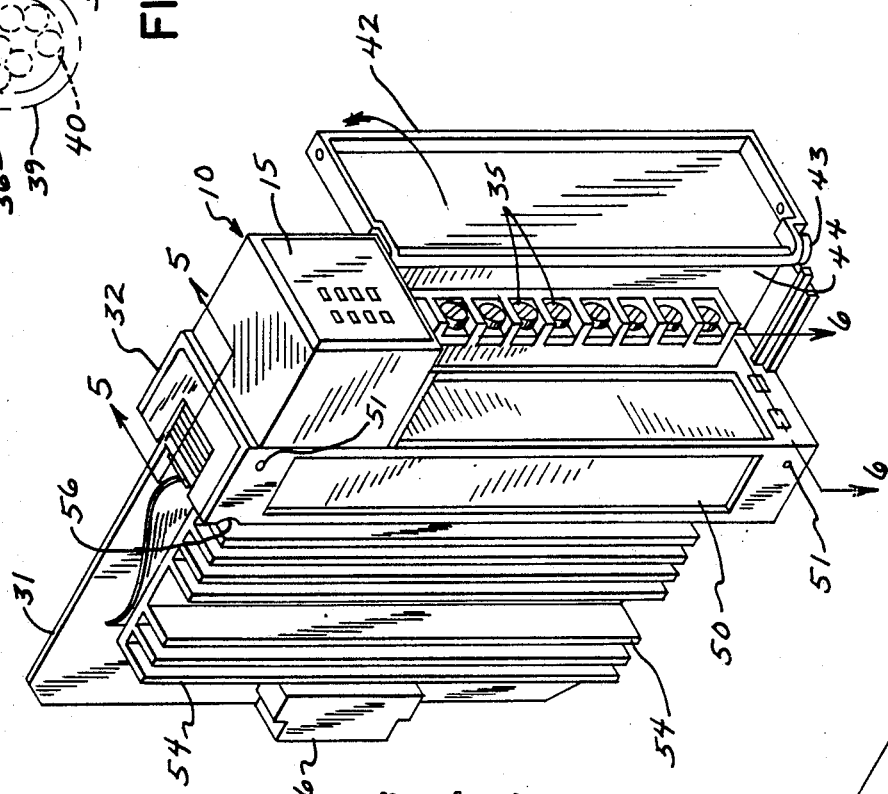
FIG. 2 is an assembly view showing a module in position for insertion into a rack.
Figure 2:
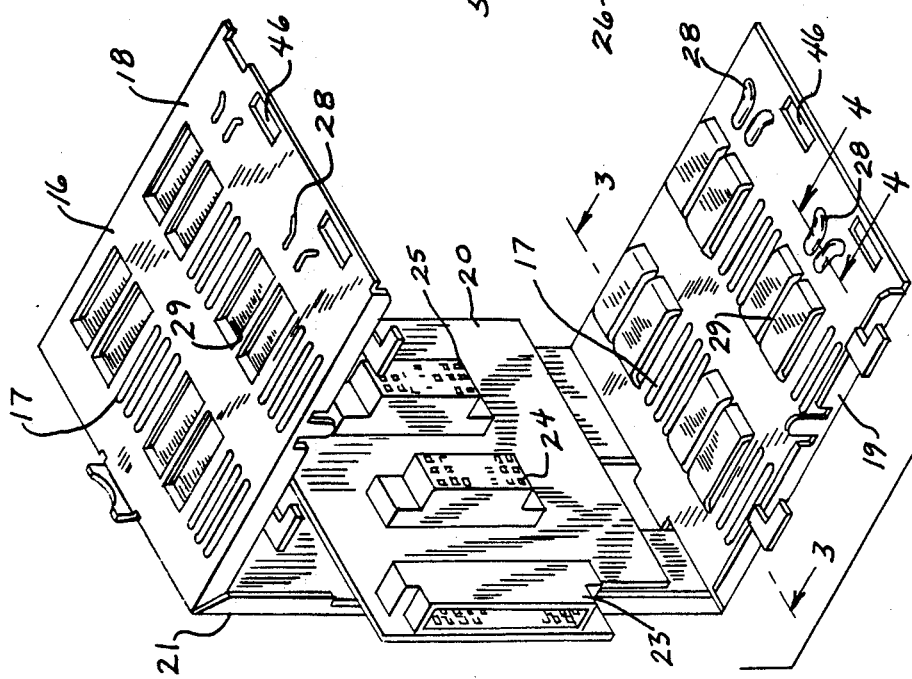

A further advantage of module 10 is seen in FIG. 2. As seen therein, the module is adapted to be easily fitted into the rack 16. The rack 16 has the usual top wall 18 from which extend the usual hanger 22, a bottom wall 19 as well as a back wall 21 with a module board 20. The module board 20 includes the usual connector portions 23 and 25 for connection with other module boards 20 in other laterally positioned I/O modules. Connector portion 24 connects with connector portion 26 on the module 10 for interconnection with the module board 20 and the connector portions 23 and 25. The guide slots 28 and 29 are provided in both the top and bottom walls 18 and 19 so tas to guide the printed circuit board 31 into position. This is specifically illustrated in FIGS. 3 and 4. This insertion also interconnects connector portion 26 with connector portion 24. The top and bottom walls 18 and 19 have vent openings 17 in order to dissipate heat from the electrical circuitry.

Figure 6:
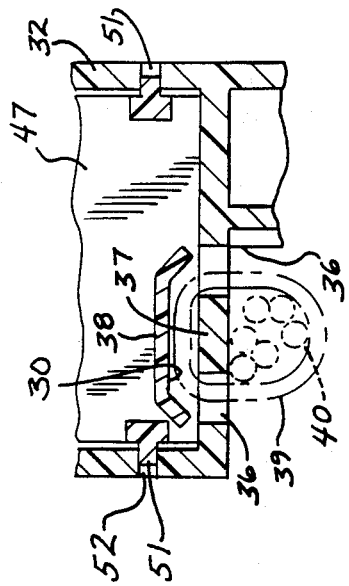
FIG. 6 is a view taken along line 6—6 of FIG. 2.

The module 10 includes a rectangular central body or casing member 32 from which extends the LED display portion 15. It also has an opening through which extends the circuit board terminal block 35 for connecting wires for the purpose of bringing electrical signals either into or out of the module. Referring specifically to FIG. 6, two openings 36 are spaced apart in the central body 32. There is also inwardly disposed a guide member 38 for a tie wire 39 which has a wall 30 to guide the wire 39 from one opening 36 to the other and behind panel wall 37. This provides a self-return guide slot for the wire 39 and is for the purpose of tying the electrical wires 40 together in order to contain them in a consolidated manner.

Referring back to FIG. 2, it is seen that there is a door 42 which is hinged to a panel portion 44 by the hinges 43. It is this door which has the outer writable surface 27. It is also seen that there is a panel portion 50 forming a wall of the body member 32 for the purpose of fixing a label or nameplate for further identification of the module.

Figure 5:
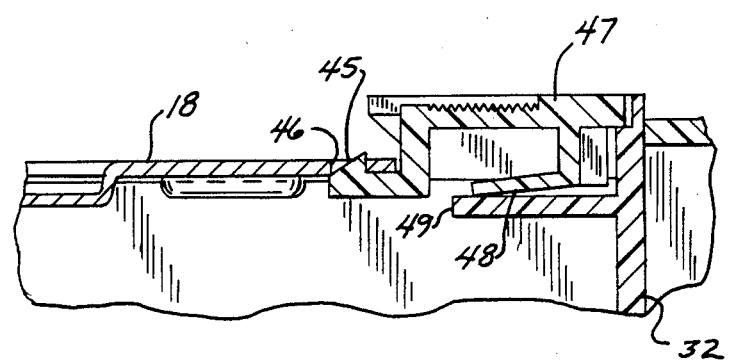
FIG. 5 is a view taken along line 5—5 of FIG. 2 but showing the module in an assembled relationship with respect to the rack.

Another important feature of the module 10 is the ability to latch the module 10 to the rack 16. Referring to FIG. 5 at both the top and the bottom of the body member 32 there are the opposing latches 45 for engagement in the openings 46 of the top and bottom walls 18 and 19 of the rack 16. Each of the latches 45 includes a latch arm 47 as well as a spring arm 48 for contact with a ledge 49. This urges the latches 45 into the opening 46. Referring again to FIG. 6, it is seen that the lower latch arm 47 is pivotally attached to the body member 32 such as by the pivots 51 extending into the openings 52 of the body member 32.

Figure 7:
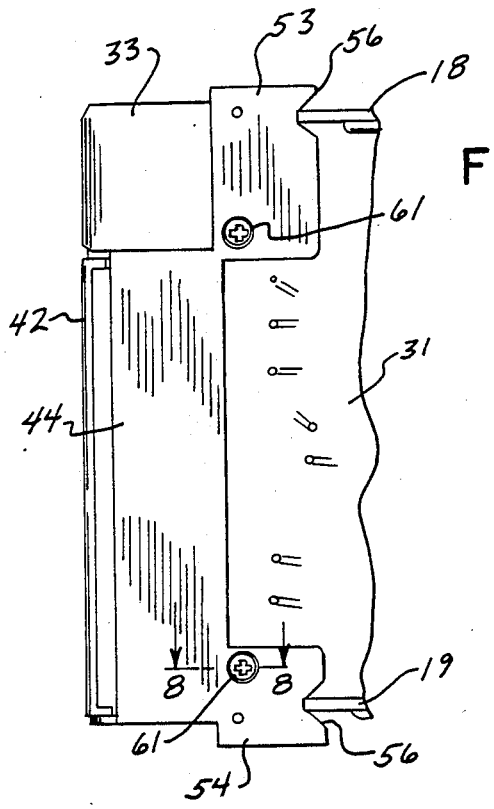
FIG. 7 is a partial view in side elevation of the module taken opposite to that shown in FIG. 2.
Figure 8:
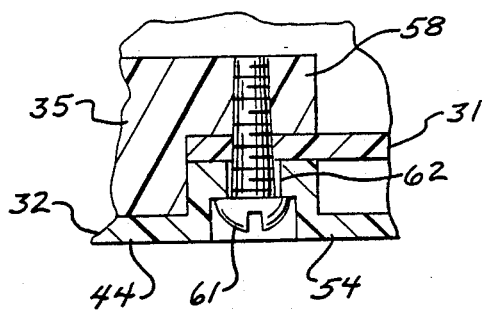
FIG. 8 is a view taken along line 8—8 of FIG. 7.

Another important feature of the invention is indicated in FIGS. 7 and 8. This is the attachment of the PC board 31 and the terminal block 35 to the body member 32. This is effected by the screws 61 which extend through the counterbore 62 in the connector flanges 53 and 54 extending from the panel portion 44 of the body member 32. Although the PC board 31 is previously secured to the terminal block 35, the screws 61 pass therethrough as well. The screws are self-tapping and will self-thread into an inner boss portion 58 of the terminal block 35. It should also be noted in conjunction with FIG. 7 that there are provided the guide notches 56 for engagement with the top and bottom walls 18 and 19, respectively of the rack 16. These act in conjunction with the latches 45 to hold the modules 10 onto the rack 16 in a secure manner.

It will thus be seen that there is now provided by the present invention a unique I/O module which has several unique features. A door 42 is provided having a writable surface 27 on the outside to readily identify the module and the module 10 provides an additional panel 50 for placement of a label for further identification of the module function. For ease of connection to the rack 16 there is afforded the guide slots 28 and 29 in the rack as well as the latching feature 45 and guide notches 56. There is also the wire tie feature as afforded by the openings 36 and the guide member 38. A further unique feature is the fact that the PC board 31 can be readily attached to the module such as by means of the self-tapping screw 61 and boss 58. This helps reduce production costs.

The module of this invention is economically produced as all of the component parts can be readily produced from a resinous plastic composition. An exception, of course, is the optional feature of the heat dissipating fins 54 which preferably will be composed of aluminum. The writable surface 27 has been indicated as being composed of a particular plastic material. Other resinous plastics or other types of writable surfaces could be employed.

We claim:

1. A module for electrical connection to a rack forming part of a programmable controller which comprises:
    a body member having a display portion and a circuit board connector portion;
    a circuit board connected to said body member connector portion;
    a door hingedly attached to said body member; and
    snap fitment means extending from said body member for engagement with an engageable surface of an electrical rack forming a part of a programmable controller, said snap fitment means including a biased latch arm pivotally attached to said body member for releasable engagement with the engageable surface of the rack by a pivoting of said arm.

2. The module of claim 1 wherein said biased latch arm includes a spring arm for contact with a support surface in said body member.

3. A module for electrical connection to a rack forming a part of programmable controller which comprises:
    a body member having a display portion and a connector portion for connection with a circuit board terminal block;
    a door hingedly attached to said body member; and
    a self-return guide means for a wire-type tie operatively associated with said body member to guide a portion of said wire-type tie into and out of said body member said wire-type tie securing wires which are connected to said terminal block to said body member.

4. The module of claim 3 wherein said body member includes a panel wall disposed on said body member and said guide means is defined by two openings through said panel wall and a wall surface disposed behind said panel wall and aligned with said two openings.

* * * * *

UNITED STATES PATENT AND TRADEMARK OFFICE
CERTIFICATE OF CORRECTION

PATENT NO. : 4,920,453

DATED : April 24, 1990

INVENTOR(S) : Onose and Ott

It is certified that error appears in the above-identified patent and that said Letters Patent is hereby corrected as shown below:

Column 2, line 52   "interfere" should read --interface--
Column 3, line 15   "tas" should read --as--
Column 3, line 27   delete "central" after "the"
Column 3, line 28   insert --section-- before 32
Column 3, line 50   "opening" should read --openings--
Claim 1, line 2     insert --a-- before "part"
Claim 3, line 10    Insert --,-- after "member"

Signed and Sealed this

Third Day of September, 1991

*Attest:*

HARRY F. MANBECK, JR.

*Attesting Officer*  *Commissioner of Patents and Trademarks*